(12) United States Patent
Lee et al.

(10) Patent No.: US 11,855,204 B2
(45) Date of Patent: Dec. 26, 2023

(54) ULTRA HIGH-DENSITY MEMORY AND MULTI-LEVEL MEMORY DEVICE AND METHOD OF FABRICATING THE SAME

(71) Applicant: UNIST (Ulsan National Institute of Science and Technology), Ulju-gun (KR)

(72) Inventors: Jun Hee Lee, Ulsan (KR); Hyun Jae Lee, Ulsan (KR); Chang Hoon Kim, Ulsan (KR)

(73) Assignee: UNIST (Ulsan National Institute of Science and Technology), Ulsan (KR)

( * ) Notice: Subject to any disclaimer, the term of this patent is extended or adjusted under 35 U.S.C. 154(b) by 369 days.

(21) Appl. No.: 17/233,608

(22) Filed: Apr. 19, 2021

(65) Prior Publication Data

US 2021/0328063 A1    Oct. 21, 2021

Related U.S. Application Data

(63) Continuation of application No. PCT/KR2021/002083, filed on Feb. 18, 2021.

(30) Foreign Application Priority Data

Apr. 20, 2020  (KR) .......................... 10-2020-0047206
Feb. 9, 2021   (KR) .......................... 10-2021-0018617

(51) Int. Cl.
  *H01L 29/78*   (2006.01)
  *H01L 29/66*   (2006.01)
  (Continued)

(52) U.S. Cl.
  CPC .. *H01L 29/78391* (2014.09); *H01L 29/40111* (2019.08); *H01L 29/516* (2013.01); *H01L 29/6684* (2013.01); *H10B 51/30* (2023.02)

(58) Field of Classification Search
  CPC ............. H01L 29/40111; H01L 29/512; H01L 29/516; H01L 29/6684; H01L 29/78391; H10B 51/30
  See application file for complete search history.

(56) References Cited

U.S. PATENT DOCUMENTS

| 7,465,980 B2 | 12/2008 | Arimoto et al. |
| 8,023,309 B2 | 9/2011  | Tanaka et al.  |

(Continued)

FOREIGN PATENT DOCUMENTS

| CN | 107393961 A * | 11/2017 | ....... H01L 21/02181 |
| JP | 2009-099606 A |  5/2009 |                       |

(Continued)

OTHER PUBLICATIONS

International Search Report for International Application No. PCT/KR2021/002083 dated Jun. 7, 2021, 2 pages.

(Continued)

*Primary Examiner* — Matthew E Warren
(74) *Attorney, Agent, or Firm* — FINCH & MALONEY PLLC

(57) ABSTRACT

Provided is a memory device. The memory device includes: a substrate; a gate insulating film disposed on the substrate; a ferroelectric thin film disposed on the gate insulating film; a blocking film disposed on the ferroelectric thin film; and a gate pattern disposed on the blocking film, wherein the ferroelectric thin film includes a spacer having a fixed polarization regardless of an electric field that is applied from an outside, and a ferroelectric domain having a polarization controlled by the electric field that is applied from the outside, and a plurality of spacers and a plurality of ferroelectric domains are alternately and repeatedly provided in a direction parallel to a top surface of the substrate (in a b-lattice direction).

13 Claims, 15 Drawing Sheets

(51) Int. Cl.
*H01L 21/28* (2006.01)
*H01L 29/51* (2006.01)
*H10B 51/30* (2023.01)

(56) References Cited

U.S. PATENT DOCUMENTS

| | | |
|---|---|---|
| 10,702,940 B2 | 7/2020 | Heo et al. |
| 11,515,419 B2 | 11/2022 | Yoo |
| 2004/0057319 A1* | 3/2004 | Dimmler ............. G11C 11/5657 |
| | | 257/E29.272 |
| 2009/0097299 A1 | 4/2009 | Tanaka et al. |
| 2018/0277683 A1* | 9/2018 | Han ................. H01L 29/40111 |
| 2019/0131458 A1* | 5/2019 | Yoo .................... H10N 70/8836 |
| 2019/0172539 A1* | 6/2019 | Slesazeck ......... H01L 29/40111 |
| 2019/0296122 A1* | 9/2019 | Ino .................... H01L 29/78391 |
| 2020/0058658 A1 | 2/2020 | Heo et al. |

FOREIGN PATENT DOCUMENTS

| | | |
|---|---|---|
| KR | 10-2006-0051154 A | 5/2006 |
| KR | 10-2016-0119659 A | 10/2016 |
| KR | 10-2019-0101798 A | 9/2019 |
| KR | 10-2019-0134910 A | 12/2019 |
| KR | 10-2020-0021276 A | 2/2020 |
| KR | 10-2020-0024067 A | 3/2020 |
| WO | 2018182267 A1 | 10/2018 |

OTHER PUBLICATIONS

Written Opinion of the International Searching Authority for International Application No. PCT/KR2021/002083 dated Jun. 7, 2021, 3 pages.

\* cited by examiner

[FIG.14]
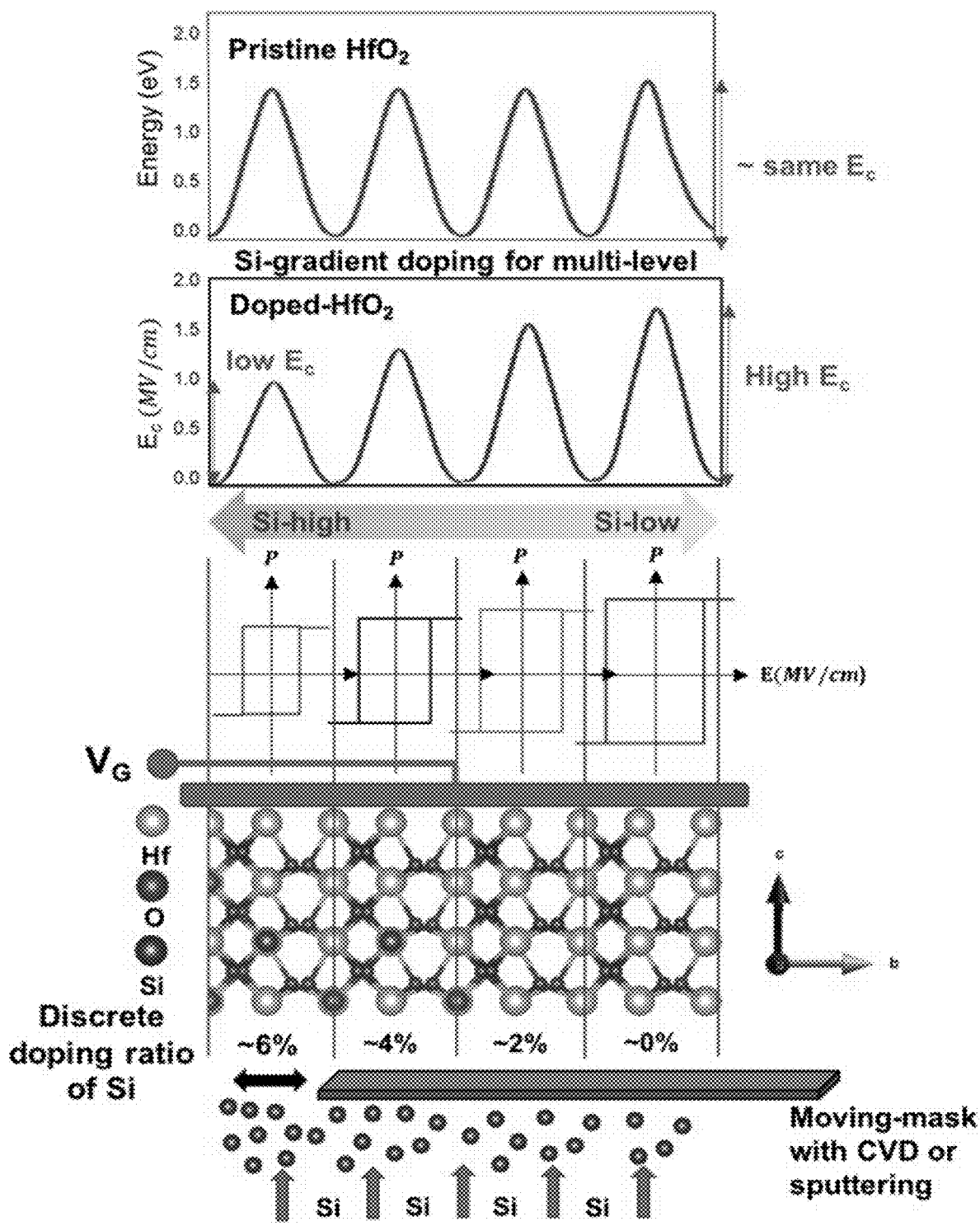

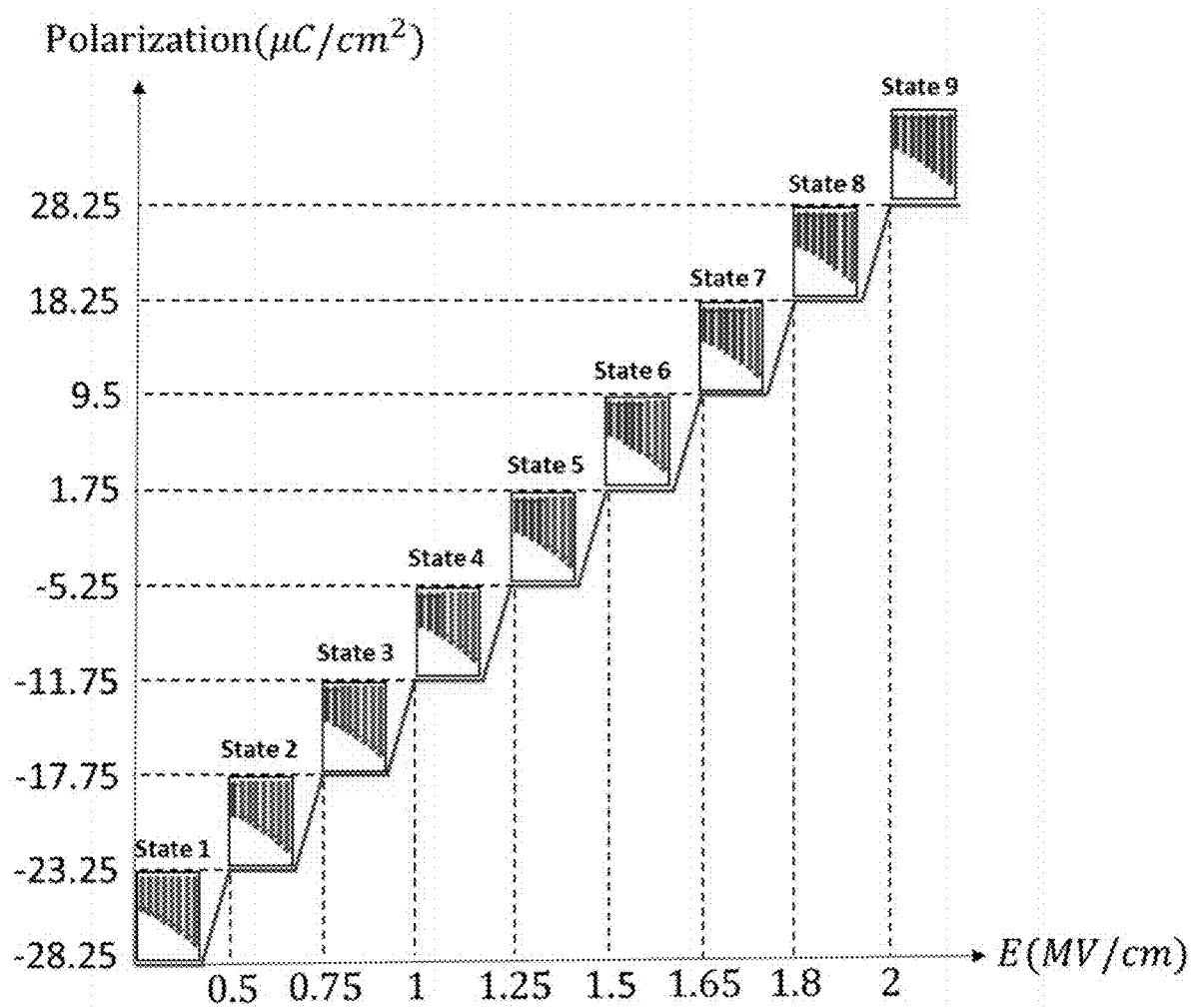
[FIG.15]

ULTRA HIGH-DENSITY MEMORY AND MULTI-LEVEL MEMORY DEVICE AND METHOD OF FABRICATING THE SAME

TECHNICAL FIELD

The present disclosure relates to a memory device and a manufacturing method thereof, and more particularly, to an ultra-high density memory and a multilevel memory device, and a manufacturing method thereof.

BACKGROUND ART

In a global semiconductor market, memory devices account for 30% or more of the entire semiconductor market. In detail, according to market research firms, a size of a memory device market is expected to reach 110.5 billion dollars (approximately 131 trillion won), accounting for 30% of the entire semiconductor market (368.3 billion dollars).

As the memory device market grows, memory devices having various characteristics are being developed.

For example, Korean Unexamined Patent Publication No. 10-2016-0119659 discloses a nonvolatile memory device including: a charge storage element having a MOS capacitor structure, and including a control gate terminal and a body terminal connected to a word line and a body bias line, respectively; a first half-MOS selection transistor including a first selection gate terminal connected to the word line and a first impurity junction terminal connected to a bit line, and configured to share the body terminal with the charge storage element; and a second half-MOS selection transistor including a second selection gate terminal connected to the word line and a second impurity junction terminal connected to a source line, and configured to share the body terminal with the charge storage element, wherein the first half-MOS selection transistor and the second half-MOS selection transistor are connected in series on both sides of the charge storage element, respectively.

As another example, Korean Unexamined Patent Publication No. 10-2019-0101798 discloses a nonvolatile memory device including a plurality of unit cells, wherein each of the unit cells includes: a first active region extending in a first direction within a substrate; a floating gate configured as a single layer and extending in a second direction to intersect the first active region; a first selection gate disposed in parallel with the floating gate to intersect the first active region adjacent to a first side surface of the floating gate; a second selection gate disposed in parallel with the floating gate to intersect the first active region adjacent to a second side surface of the floating gate; a first dielectric layer disposed between the first side surface of the floating gate and a first side surface of the first selection gate; and a second dielectric layer disposed between the second side surface of the floating gate and a first side surface of the second selection gate.

DISCLOSURE

Technical Problem

One technical object of the present disclosure is to provide an ultra-high density memory and a multilevel memory device, and a manufacturing method thereof, capable of storing information in a line-type natural ferroelectric domain of a unit cell having a width (e.g., 0.5 nm), in which unit cells are inherently famed within a material (e.g., orthorhombic $HfO_2$ or $(Hf, Zr)O_2$) and arranged in a b-lattice direction.

Another technical object of the present disclosure is to provide a high-reliability deterministic multilevel memory device and a manufacturing method thereof, capable of storing information in a minimum unit corresponding to the width (e.g., 0.5 nm) of the unit cell, which is substantially regularly and naturally patterned within the material (e.g., $HfO_2$ or $(Hf, Zr)O_2$) and has a size and distribution (arrangement) that are not arbitrarily set.

Still another technical object of the present disclosure is to provide a highly integrated multilevel memory device and a manufacturing method thereof.

Yet another technical object of the present disclosure is to provide a multilevel memory device and a manufacturing method thereof, capable of reducing a manufacturing cost, significantly increasing an information storage capacity, and simplifying a manufacturing process.

The technical objects of the present disclosure are not limited to the above-described objects.

Technical Solution

In order to achieve the above technical objects, the present disclosure provides a memory device.

In accordance with an embodiment, the memory device includes: a substrate; a gate insulating film disposed on the substrate; a ferroelectric thin film disposed on the gate insulating film; a blocking film disposed on the ferroelectric thin film; and a gate pattern disposed on the blocking film, wherein the ferroelectric thin film includes a spacer having a fixed polarization (e.g., of zero (0)) regardless of an electric field that is applied from an outside, and a ferroelectric domain (e.g., which may have a width corresponding to half of a width of a unit cell) having a polarization (e.g., 20 to 60 $uC/cm^2$) controlled by the electric field that is applied from the outside, and a plurality of spacers and a plurality of ferroelectric domains are alternately and repeatedly provided in a direction parallel to a top surface of the substrate.

According to an embodiment, in the direction parallel to the top surface of the substrate (e.g., in a b-lattice direction of orthorhombic $HfO_2$), a width of the gate pattern may be greater than or equal to a width of the ferroelectric domain, and may be narrower than a sum of the width of the ferroelectric domain and a width of the spacer.

According to an embodiment, a plurality of gate patterns may be provided on the substrate, and each of the gate patterns may overlap one of the ferroelectric domains.

According to an embodiment, in the direction parallel to the top surface of the substrate, a width of the gate pattern may be wider than a sum of a width of the ferroelectric domain and a width of the spacer.

According to an embodiment, the gate pattern may overlap the ferroelectric domains.

According to an embodiment, one of the spacers and one of the ferroelectric domains may form one memory cell.

According to an embodiment, each of the spacers may be provided between the ferroelectric domains, so that the polarizations of the ferroelectric domains may be controlled independently from each other (e.g., may be controlled within a width of 0.5 nm in the b-lattice direction).

In order to achieve the above technical objects, the present disclosure provides a semiconductor device.

In accordance with an embodiment, the semiconductor device includes: a substrate; a ferroelectric thin film disposed on the substrate, and including a plurality of ferroelectric domains spaced apart from each other and having polarizations controlled independently from each other; and a gate pattern disposed on the ferroelectric thin film.

According to an embodiment, the ferroelectric domains may be laterally spaced apart from each other (e.g., the ferroelectric domains may be spaced apart from each other in a b-lattice direction of an orthorhombic structure).

According to an embodiment, the gate pattern may overlap at least one of the ferroelectric domains.

According to an embodiment, the ferroelectric thin film may include a metal oxide doped with a doping element, and the doping element may have a concentration gradient within the ferroelectric thin film in a direction parallel to a top surface of the substrate.

According to an embodiment, the doping element may include at least one of Si, Al, Ge, La, Y, Ba, Sr, Ti, Zr, Sn, Sc, Ta, Nb, Fe, Pr, or Sb.

Advantageous Effects

In accordance with an embodiment of the present disclosure, the memory device includes: a substrate; a gate insulating film disposed on the substrate; a ferroelectric thin film disposed on the gate insulating film; a blocking film disposed on the ferroelectric thin film; and a gate pattern disposed on the blocking film, wherein the ferroelectric thin film includes a spacer having a fixed polarization regardless of an electric field that is applied from an outside, and a ferroelectric domain having a polarization controlled by the electric field that is applied from the outside, and a plurality of spacers and a plurality of ferroelectric domains are alternately and repeatedly provided in a direction parallel to a top surface of the substrate. For example, when the ferroelectric thin film is $HfO_2$, the direction may be a b-lattice direction.

Due to the spacers, the polarizations of the ferroelectric domains can be controlled independently from each other (e.g., with a width of 0.5 nm in the b-lattice direction), so that a multilevel memory device, which is a memory device that is highly integrated by using the ferroelectric thin film, can be provided.

DESCRIPTION OF DRAWINGS

FIGS. 7 and 8 are views for describing a memory device including a ferroelectric thin film according to a first embodiment of the present disclosure, in which FIG. 7 is a view for describing a memory device for switching a ferroelectric polarization within an arbitrary unit cell width by a flat strip in a b-lattice direction, and FIG. 8 is a view for describing an ultra-highly integrated memory for individually storing information in a ferroelectric domain through a gate pattern having a width of 0.3 nm in a Y-direction (e.g., the b-lattice direction of orthorhombic $HfO_2$).

FIG. 14 is a view for describing a method of manufacturing a multilevel ferroelectric thin film having a lateral doping concentration gradient in a b-lattice direction according to a second embodiment of the present disclosure.

FIG. 15 is a view for describing a multilevel memory characteristic of a semiconductor device including a ferroelectric thin film according to the embodiment of the present disclosure.

MODE FOR INVENTION

Hereinafter, exemplary embodiments of the present disclosure will be described in detail with reference to the accompanying drawings. However, the technical idea of the present disclosure is not limited to the embodiments, but may be realized in different forms. The embodiments introduced herein are provided to sufficiently deliver the idea of the present disclosure to those skilled in the art so that the disclosed contents may become thorough and complete.

In addition, in the various embodiments of the present disclosure, the terms such as first, second, and third are used to describe various elements, but the elements are not limited to the tams. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the terms such as "including" and "having" are used to designate the presence of features, numbers, steps, elements, or combinations thereof described in the present disclosure, and shall not be construed to preclude any possibility of presence or addition of one or more other features, numbers, steps, elements, or combinations thereof. In addition, the team "connection" used herein is used to include both indirectly and directly connecting a plurality of elements.

Further, in the following description of the present disclosure, detailed descriptions of known functions and configurations incorporated herein will be omitted when they may make the subject matter of the present disclosure unnecessarily unclear.

Figure 1:
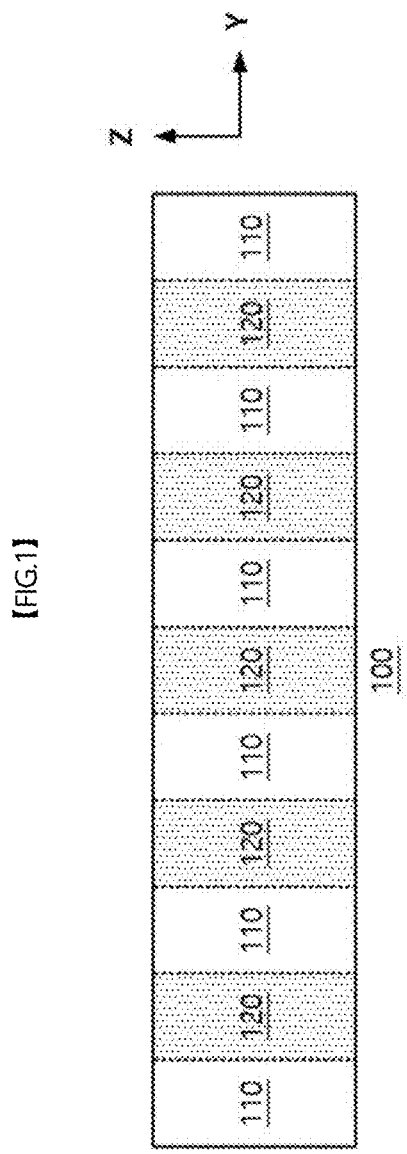
FIG. 1 is a view for describing a ferroelectric thin film arranged in a Y-direction (e.g., a b-lattice direction in a case of orthorhombic $HfO_2$) according to an embodiment of the present disclosure.
Figure 2:
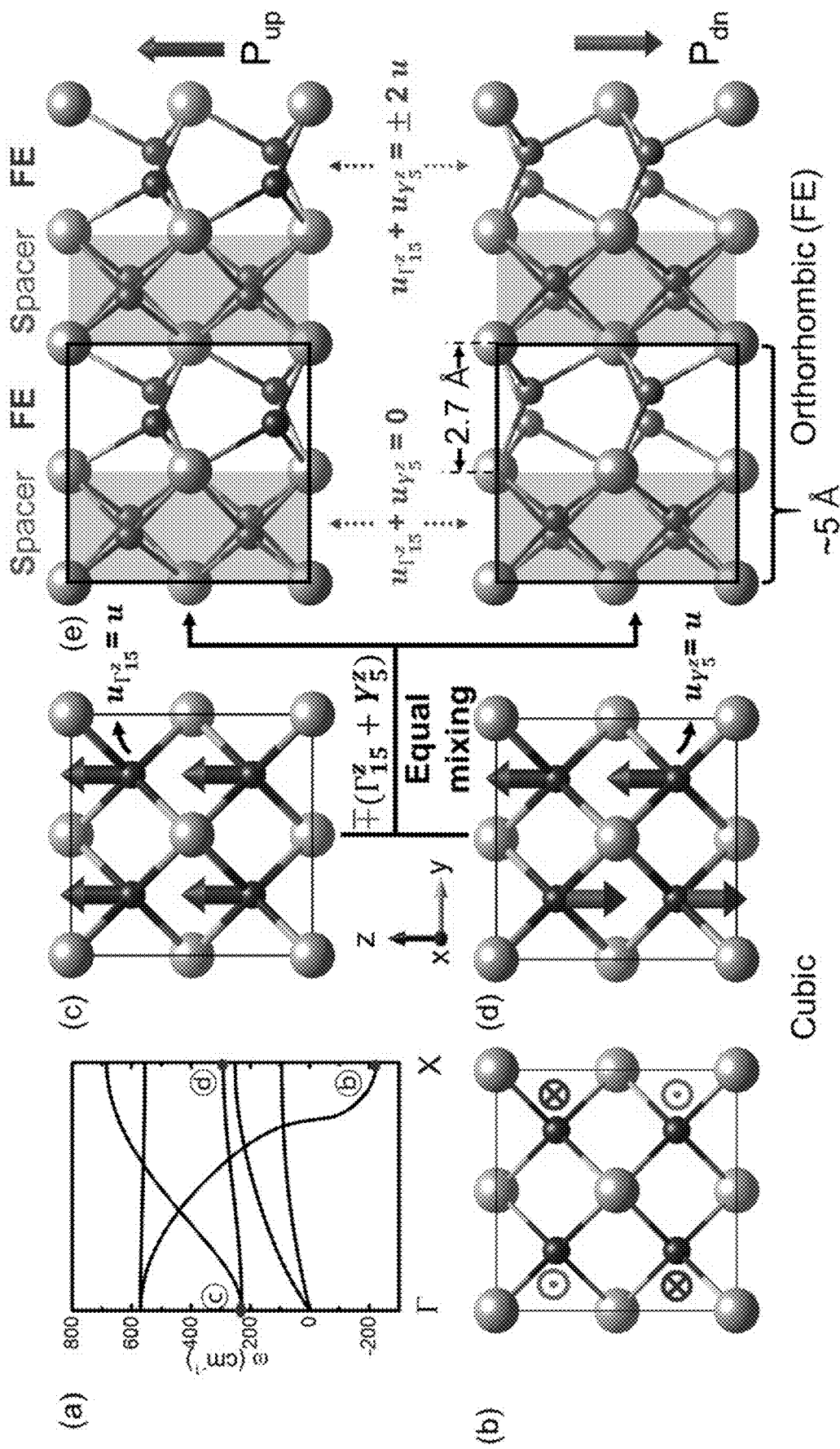
FIG. 2 is a view for describing a phenomenon and a cause thereof of a spacer and a ferroelectric domain of the ferroelectric thin film according to the embodiment of the present disclosure, especially, for example, for describing a spacer and a ferroelectric domain having a total width of 0.5 nm in a b-lattice direction.

FIG. 1 is a view for describing a ferroelectric thin film according to an embodiment of the present disclosure, and FIG. 2 is a view for describing a spacer and a ferroelectric domain of the ferroelectric thin film according to the embodiment of the present disclosure, in which FIG. 2(a) is a view for describing a flat phonon band in a cubic structure of the ferroelectric thin film according to the embodiment of the present disclosure, FIGS. 2(b) to 2(d) are views for describing phonon modes in the cubic structure of the ferroelectric thin film according to the embodiment of the present disclosure, and FIG. 2(e) is a view showing an atomic structure for describing ultra-local ferroelectric polarization characteristics due to a flat band in an orthorhombic structure of the ferroelectric thin film according to the embodiment of the present disclosure. In FIGS. 2(a), (b), (c), and (d) correspond to the phonon modes of FIGS. 2(b), 2(c), and 2(d), respectively.

Referring to FIGS. 1 and 2, according to an embodiment of the present disclosure, a ferroelectric thin film 100 may include a plurality of spacers 110 and a plurality of ferroelectric domains 120. The spacers 110 and the ferroelectric domains 120 may be laterally, alternately, and repeatedly stacked. For example, the spacers 110 and the ferroelectric domains 120 may be formed (stacked) laterally in a b-lattice direction.

According to one embodiment, the ferroelectric domain 120 may have a polarization controlled by an electric field that is applied from an outside, and the spacer 110 may have a fixed polarization of 0 that does not substantially react to the electric field that is applied from the outside. The ferroelectric domains 120 may be physically spaced apart from each other and electrically separated from each other by the spacers 110, so that polarization characteristics of the ferroelectric domains 120 adjacent to each other may be controlled substantially completely independently from each other. For example, one of the ferroelectric domains 120 adjacent to each other may have a polarization in one direction (+Z), and the remaining one of the ferroelectric domains 120 may have a polarization in a direction (−Z) that is antiparallel to the one direction (+Z).

According to one embodiment, the ferroelectric domain 120 may have a phonon that may have a displacement in a first axis (Z) direction. Accordingly, due to the electric field applied from the outside, the phonon of the ferroelectric domain 120 may have a displacement in the one direction (+Z) or in the antiparallel (−Z) direction with respect to the one direction based on the first axis (Z) direction.

Meanwhile, the spacer 110 may not substantially include any displacement caused by a phonon. Accordingly, the spacer 110 may substantially completely block elastic interaction between phonons of the ferroelectric domains 120, and the spacer 110 may not be polarized by the electric field applied from the outside.

According to one embodiment, the ferroelectric thin film 100 may be a hafnium oxide having an orthorhombic crystal structure. In general, the hafnium oxide may have an orthorhombic crystal structure at a room temperature. However, as a temperature increases, the hafnium oxide may sequentially have a tetragonal crystal structure and a cubic crystal structure. For example, the hafnium oxide may have the tetragonal crystal structure at a temperature of 2870 K, and may have the cubic crystal structure at a temperature exceeding 2870 K.

In detail, for example, when the ferroelectric thin film 100 is a hafnium oxide, the hafnium oxide may be manufactured on a substrate by pulsed laser deposition (PLD) at a temperature of 800° C. or higher. Immediately after the pulsed laser deposition, the hafnium oxide may be cooled to the room temperature, so that the hafnium oxide may mainly include an orthorhombic crystal phase. In this case, as an amount of the orthorhombic crystal phase included in the hafnium oxide increases, the hafnium oxide may have a structure of the ferroelectric thin film 100 in which the spacers 110 and the ferroelectric domains 120 are alternately and repeatedly stacked.

As described above, when the ferroelectric thin film 100 is a hafnium oxide, the substrate on which the ferroelectric thin film 100 is deposited may have a lattice constant that is smaller than or greater than a lattice constant of the hafnium oxide. For example, the ferroelectric thin film 100 may be deposited on a substrate formed of yttria-stabilized zirconia (YSZ) having a lattice constant of approximately 5.12 Å, TiN, W, or the like. Accordingly, the spacers 110 and the ferroelectric domains 120 may be easily generated in the ferroelectric thin film 100.

As described above, when the ferroelectric thin film 100 is a hafnium oxide, the hafnium oxide may be sequentially transformed into the tetragonal crystal structure and a monoclinic crystal structure from the cubic crystal structure when cooled, and may be stabilized in the orthorhombic crystal structure at a room temperature.

In a cubic crystal structure at a high temperature, the phonon mode shown in FIG. 2(b) having lowest energy, that is, a phonon mode in which oxygen atoms having displacements in parallel (+X) and antiparallel (−X) directions based on a third axis direction (an X-direction) are provided may be mainly provided based on a plane (a YZ-plane) that is parallel to a first axis (a Z-axis) and a second axis (a Y-axis). In this case, the first to third axes may be perpendicular to each other.

The cubic structure may be phase-transited into the tetragonal structure by condensation of the phonon mode shown in FIG. 2(b). Thereafter, the phonon of FIG. 2(c) (a first phonon mode, $\Gamma_{15}^{Z}$) and the phonon of FIG. 2(d) (a second phonon mode, $Y_{5}^{Z}$) existing in a flat strip (band) in the tetragonal structure may be simultaneously condensed so as to be transformed into the orthorhombic structure. In this case, the phonon modes of FIG. 2(c) and FIG. 2(d) may be condensed and mixed with substantially completely the same amplitude, so that as shown in FIG. 2(e), the ferroelectric thin film 100 including the spacer 110 and the ferroelectric domain 120 and FE may be provided.

In other words, the first phonon mode may include oxygen elements movable in the direction (+Z) that is parallel to the first axis Z based on a plane (i.e., an XZ-plane) including the first axis Z. That is, when a unit cell of the ferroelectric thin film 100 having a cubic crystal structure based on the XZ-plane includes a first half-unit cell and a second half-unit cell, the first phonon mode may be configured such that the oxygen element in the first half-unit cell and the oxygen element in the second half-unit cell have displacements in the same direction (+Z). On the contrary, the second phonon mode may include oxygen elements movable in parallel (+Z) and antiparallel (−Z) directions with respect to the first axis Z based on the XZ-plane. In other words, the second phonon mode may be configured such that the element in the first half-unit cell (−Z) and the oxygen element in the second half-unit cell (+Z) have displacements in directions antiparallel to each other. In this case, the displacement of the oxygen element in the second phonon mode may have substantially the same magnitude as the displacement of the oxygen element in the first phonon mode. In other words, the phonons included in the oxygen elements in the first phonon mode and the second phonon mode may move with the same amplitude. Accordingly, when a hafnium oxide having a cubic crystal structure has energy corresponding to a flat band, the first phonon mode and the second phonon mode having the same amplitude may be linearly combined, a crystal lattice of the hafnium oxide may be condensed in the cubic crystal structure as the temperature decreases so as to sequentially have the tetragonal crystal structure and the orthorhombic crystal structure as described above, and the ferroelectric thin film 100 may have a structure in which the spacers 110 and the ferroelectric domains 120 are alternately and consecutively arranged as described above with reference to FIG. 1.

Since the spacer 110 of the ferroelectric thin film 100 has oxygen atoms having a displacement of 0, the spacer 110 may substantially completely block the elastic interaction between the ferroelectric domains 120 and FE, and oxygen atoms of the ferroelectric domain 120 and FE may have a displacement in the first axis (Z-axis) direction. In addition, each of the ferroelectric domain 120 and the spacer 110 in the ferroelectric thin film 100 may have a width corresponding to half of a width of the unit cell. In other words, one of the ferroelectric domains 120 and one of the spacers 110 may form the unit cell. The spacer 110 may serve as a natural patterning in a memory device.

In FIG. 2(e), the ferroelectric domain 120 and FE may have a first phase having a displacement in the antiparallel (−Z) direction with respect to the one direction or a second phase having a displacement in the one direction (+Z) based on the first axis Z.

In detail, when the ferroelectric domain 120 has the first phase, the phonon may have a three-dimensional space in an upward direction, and when the ferroelectric domain 120 has the second phase, the phonon may have a three-dimensional space in a downward direction. As described above, the phonon may move into the three-dimensional space, so that according to the electric field applied from the outside, the ferroelectric domain 120 having the first phase may have an up polarization, and the ferroelectric domain 120 having the second phase may have a down polarization.

Figure 3:
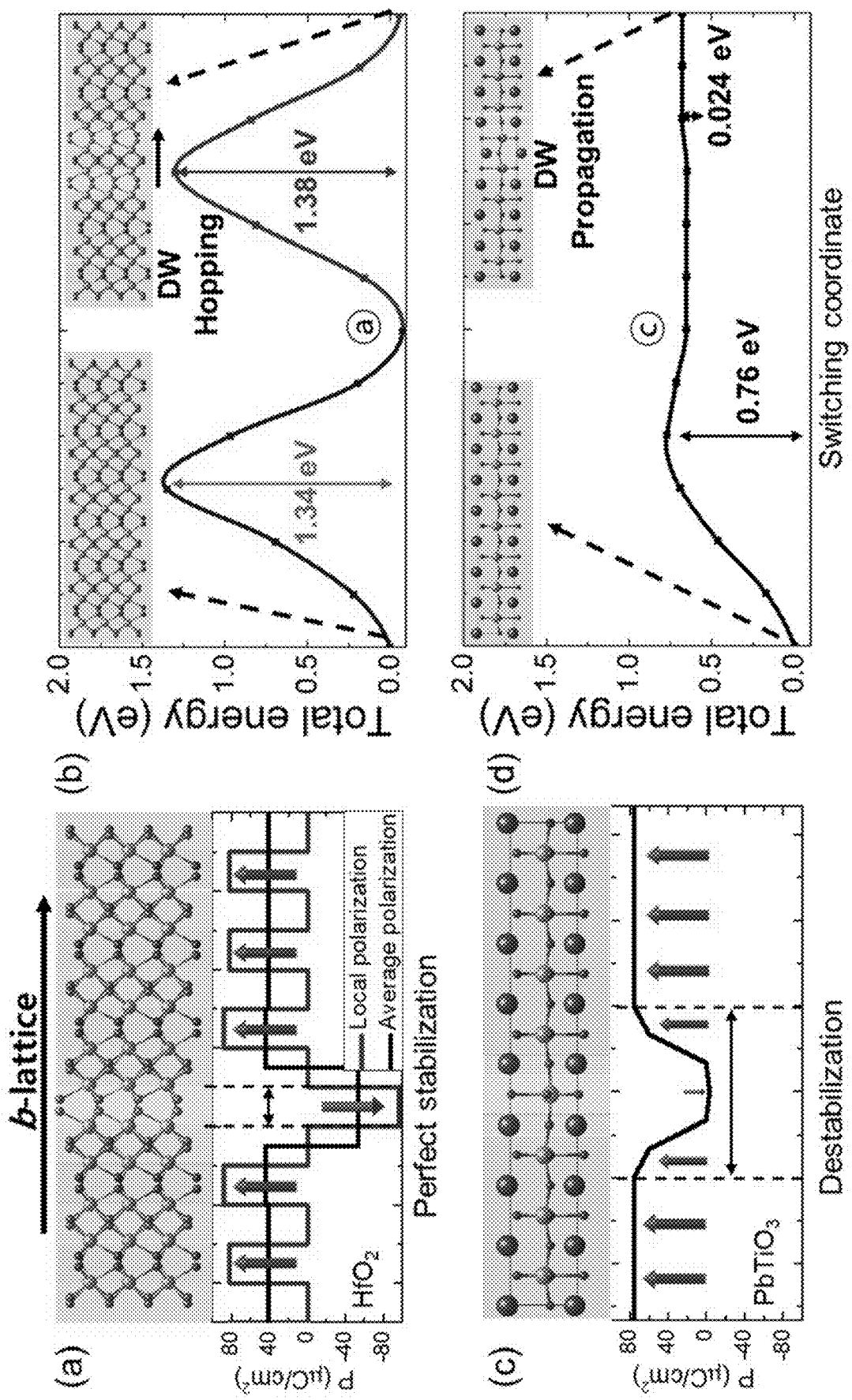
FIG. 3 is a view for describing polarization characteristics of the ferroelectric thin film according to the embodiment of the present disclosure, especially, for example, for describing stable switching of an ultra-local ferroelectric polarization existing within the width of 0.5 nm in the b-lattice direction of the ferroelectric thin film.

FIG. 3 is a view for describing polarization characteristics of the ferroelectric thin film according to the embodiment of the present disclosure, in which FIG. 3(a) is a view for describing an atomic structure and local polarization characteristics within a width of 0.5 nm in the ferroelectric thin film according to the embodiment of the present disclosure, FIG. 3(b) is a view for describing the atomic structure and energy according to a polarization in the ferroelectric thin film according to the embodiment of the present disclosure, FIG. 3(c) is a view for describing an atomic structure and polarization characteristics in a $PbTiO_3$ thin film according to a comparative example of the present disclosure, and FIG. 3(d) is a view for describing the atomic structure and energy according to a polarization in the $PbTiO_3$ thin film according to the comparative example of the present disclosure.

Referring to FIG. 3, as shown in FIG. 3(a), the spacers and the ferroelectric domains are alternately arranged, and it may be found that stable switching of the polarization is substantially perfectly performed on one ferroelectric domain, locally within a width of 0.5 nm.

In addition, as shown in FIG. 3(b), it may be found that energy required to switch a polarization of one unit cell (one ferroelectric domain) is 1.34 eV so that a polarization state is stably maintained, and it may be found that switching for a polarization of an adjacent second ferroelectric domain, which is a domain formed by a ferroelectric layer included in a unit cell that is formed laterally in the b-lattice direction with the spacer interposed therebetween, has an energy barrier of 1.38 eV. Even when the domain within a unit cell width is switched at an arbitrary position in the b-lattice direction, a switching barrier of 1.38 eV may not be substantially changed. As described above, even when the polarization having the width of 0.5 nm is switched one by one in the b-lattice direction, the barrier is not changed, so that multi-levels corresponding to a number of unit cells in the b-lattice direction may be stably implemented.

Meanwhile, as shown in FIGS. 3(c) and 3(d), a $PbTiO_3$ thin film according to a comparative example may have a domain region in which a polarization is gradually changed, and energy required to polarize one unit cell may be 0.76 eV. Accordingly, when compared to the ferroelectric thin film including the spacer, it may be found that the $PbTiO_3$ thin film that does not include the spacer has low activation energy (i.e., the energy required to polarize one unit cell).

In addition, it may be found that energy required to expand a polarized region is reduced to have a value of 0.024 eV. Therefore, it may be found that an expansion speed of a polarized region in the $PbTiO_3$ thin film according to the comparative example of the present disclosure is faster than an expansion speed of a polarized region in the ferroelectric thin film according to the embodiment of the present disclosure. Accordingly, it may be found that $PbTiO_3$ according to the comparative example is inappropriate for a multilevel device because of such energy differences.

In conclusion, the ferroelectric thin film according to an experimental example of the present disclosure may be configured such that only a polarization direction of one ferroelectric domain is selectively and stably changed, and high energy is required for propagation of a polarized region including one polarized ferroelectric domain so as to prevent the polarized region from being propagated. Therefore, the ferroelectric thin film may be used as a highly integrated memory for storing information in a width of 0.5 nm, which is local, and a deterministic multilevel material for storing information using uniform energy only in ferroelectric domains having a minimum width corresponding to a unit cell size between naturally patterned spacers. In other words, the polarization direction of the one polarized ferroelectric domain may be stably maintained, so that the polarization direction of the ferroelectric domain may be independently controlled, and thus the ferroelectric thin film may have multilevel characteristics.

Figure 4:
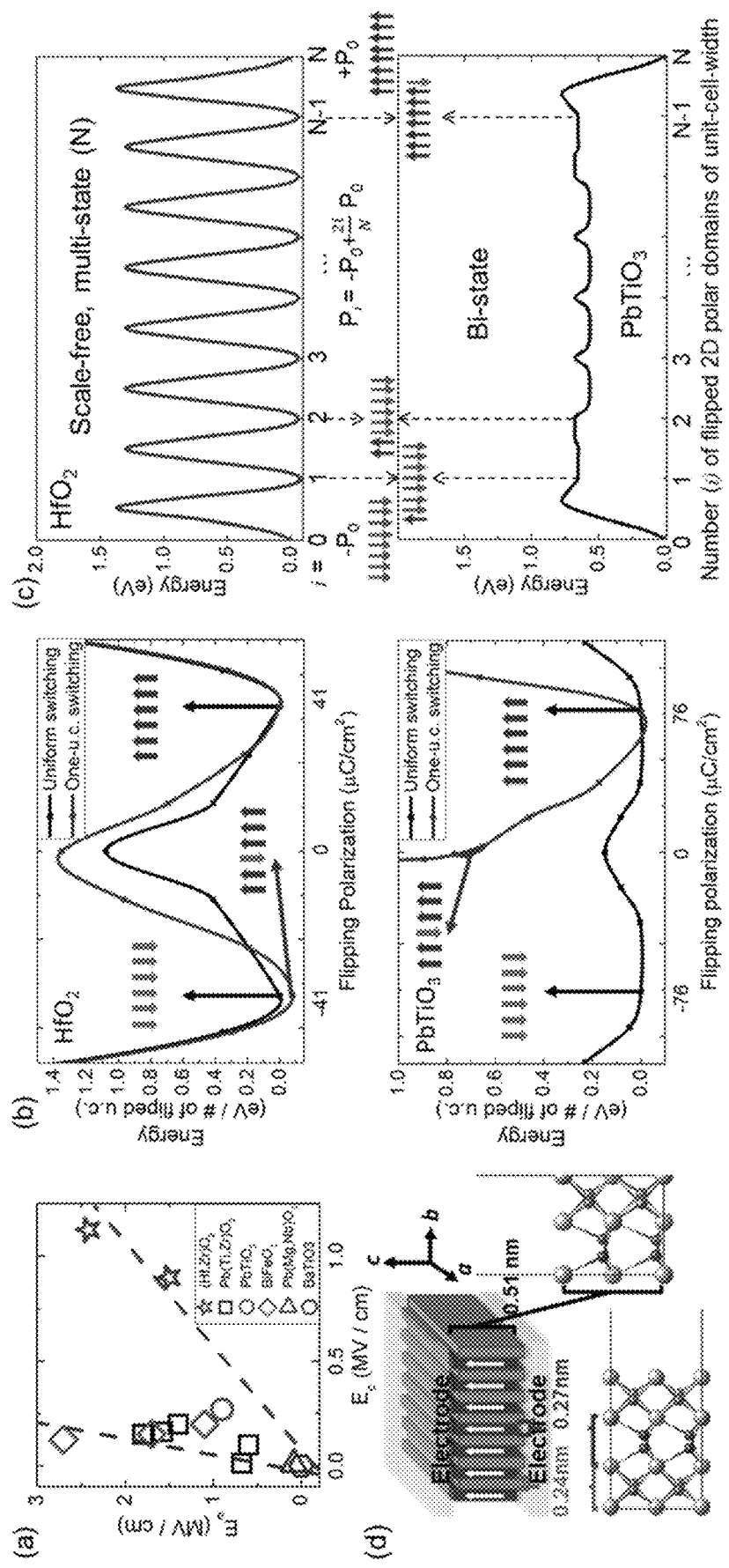
FIG. 4 is a view for describing a multilevel operation of the ferroelectric thin film according to the embodiment of the present disclosure, especially, for example, for describing a multilevel operation capable of increasing a number of levels by a number of unit cells in the Y-direction (i.e., the b-lattice direction).

FIG. 4 is a view for describing a multilevel operation of the ferroelectric thin film according to the embodiment of the present disclosure, in which FIG. 4(a) is a view obtained by measuring an activation field and a coercive field of various ferroelectric materials, FIGS. 4(b) and 4(c) are views for describing energy for switching polarization characteristics of unit cells of the ferroelectric thin film according to the embodiment of the present disclosure and $PbTiO_3$ according to the comparative example, and FIG. 4(d) is a view for describing widths and the polarization characteristics of the spacers and the ferroelectric domains of the ferroelectric thin film according to the embodiment of the present disclosure. An activation field refers to a field value required for individual polarization, and a coercive field refers to a field value required to remove an entire polarization state.

As shown in FIG. 4(a), as polarization switching occurs according to nucleation and growth of ferroelectric domains, in a case of a conventional ferroelectric material, the coercive field is generally only 1/10 of the activation field. Due to such a collective behavior, the coercive field may be reduced in proportion to a width of a domain wall. Meanwhile, in the case of the ferroelectric thin film according to the embodiment of the present disclosure, a domain wall may be negligibly thin, so that reduction of the coercive field may be significantly small. Therefore, it may be found that the domain wall is not efficiently propagated, and a high energy barrier of 1.38 eV has to be overcome as described with reference to FIG. 3(b). Since the domain wall is not propagated, it may be fount that local polarization switching within the width of 0.5 nm is possible, which is suitable for a stable multilevel device. Meanwhile, in the case of the $PbTiO_3$ thin film according to the comparative example, it may be found that an energy barrier is 0.024 eV so as to allow a domain wall to rapidly expand, so that the $PbTiO_3$ thin film may function only as a bi-level device.

As shown in of FIG. 4(b), in the case of the ferroelectric thin film according to the embodiment of the present disclosure, an inherent scale-free polarization switching characteristic may be recognized by comparing a uniform polarization and a local polarization. In other words, in the case of the ferroelectric thin film according to the embodiment of the present disclosure, it may be found that uniform polarization switching energy and local unit cell width polarization switching energy are substantially similar to each other. Meanwhile, in the case of the $PbTiO_3$ according to the comparative example, it may be found that polarization switching in a unit of a unit cell is impossible in consideration of energy.

In addition, as shown in FIG. 4(c), in the case of the ferroelectric thin film according to the embodiment of the present disclosure, it may be found that total energy and reversed barriers rarely change even when domains within an arbitrary unit cell width are reversed one by one in the b-lattice direction. The polarization switching of the ferroelectric domains of the unit cell may be stably controlled regardless of a number of the ferroelectric domains. In other words, the ferroelectric thin film may have deterministic and reproducible multi-bit characteristics corresponding to the number of the unit cells in the b-lattice direction. The ferroelectric thin film may be used to impose multilevel characteristics on a conventional ferroelectric memory such as a FeRAM or a FeFET, or may be used as a substitute for a NAND flash memory that requires multi-levels or the like.

Meanwhile, in the case of the $PbTiO_3$ according to the comparative example, it may be found that the $PbTiO_3$ stably has only two polarization states.

As shown in FIG. 4(d), when the spacer has a thickness of 0.24 nm, and the ferroelectric domain has a thickness of 0.27 nm, a vertical thickness of 0.51 nm, and a lateral side thickness of 0.75 nm or more in the ferroelectric thin film according to the embodiment of the present disclosure, the polarization characteristic of the ferroelectric domain may be stably maintained within the unit cell.

In conclusion, in the case of the ferroelectric thin film according to the embodiment of the present disclosure, it may be found that the polarization characteristics of the ferroelectric domains included in the unit cells are individually and stably adjusted by the spacer, so that multi-bits corresponding to the number of the unit cells in the b-lattice direction may be implemented.

Figure 5:
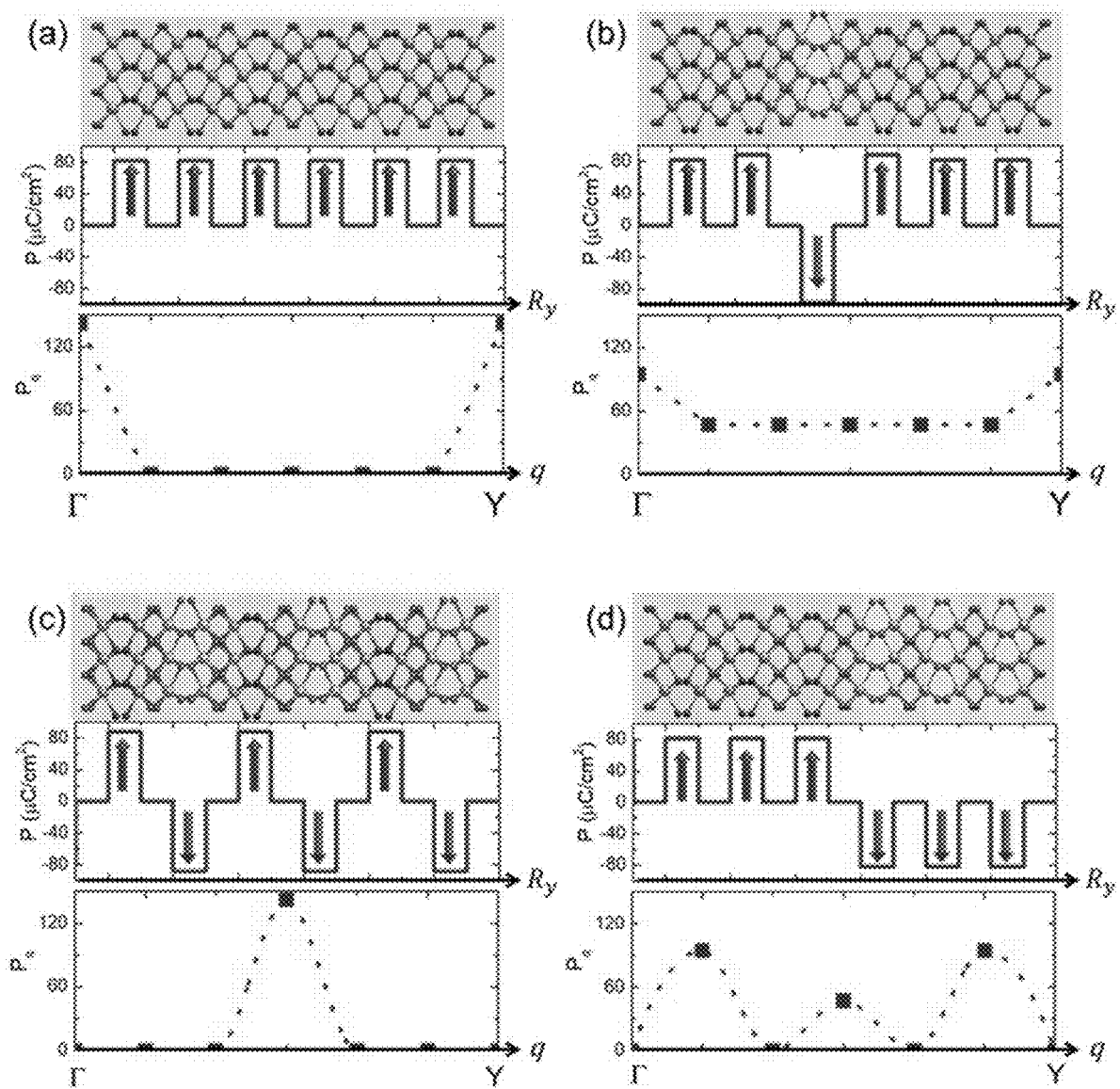
FIG. 5 is a view for describing characteristic control capable of arbitrarily switching polarizations of the ferroelectric thin film according to the embodiment of the present disclosure, in which the polarizations respectively have a width of 0.5 nm and are aligned in the Y-direction (i.e., the b-lattice direction), and Fourier analysis results, which may be used for a FeRAM and a NAND flash memory.

FIG. 5 is a view for describing polarization characteristic control and Fourier analysis results of the ferroelectric thin film according to the embodiment of the present disclosure.

Referring to FIG. 5, for example, in a case where polarizations of six unit cells are independently switched, it may be found through Fourier analysis that the case corresponds to a linear combination of phonons belonging to a flat band. In detail, in a case where the polarizations of the six unit cells are identically switched as shown in FIG. 5(a), it may be found that the case corresponds to a linear combination of Γ and Y phonon modes; when a polarization of one ferroelectric domain is switched so as to be reversed as shown in FIG. 5(b), it may be found that the Γ and Y phonon modes mainly contribute, and contribution of other phonon modes is low; when the polarizations of the ferroelectric domains of the six unit cells are switched so as to be alternately reversed as shown in FIG. 5(c), it may be found that one phonon mode at an intermediate point between Γ and Y contributes; and when the polarizations of the ferroelectric domains of three unit cells on a right side are switched so as to be reversed as shown in FIG. 5(d), it may be found that a plurality of phonon modes of the flat band contribute. As described above, the multi-levels corresponding to the number of the unit cells in the b-lattice direction may be implemented.

In conclusion, it may be found that polarizations of a plurality of ferroelectric domains in a plurality of unit cells are switched independently from each other, and multi-bits may be implemented by using such characteristics.

Figure 6:
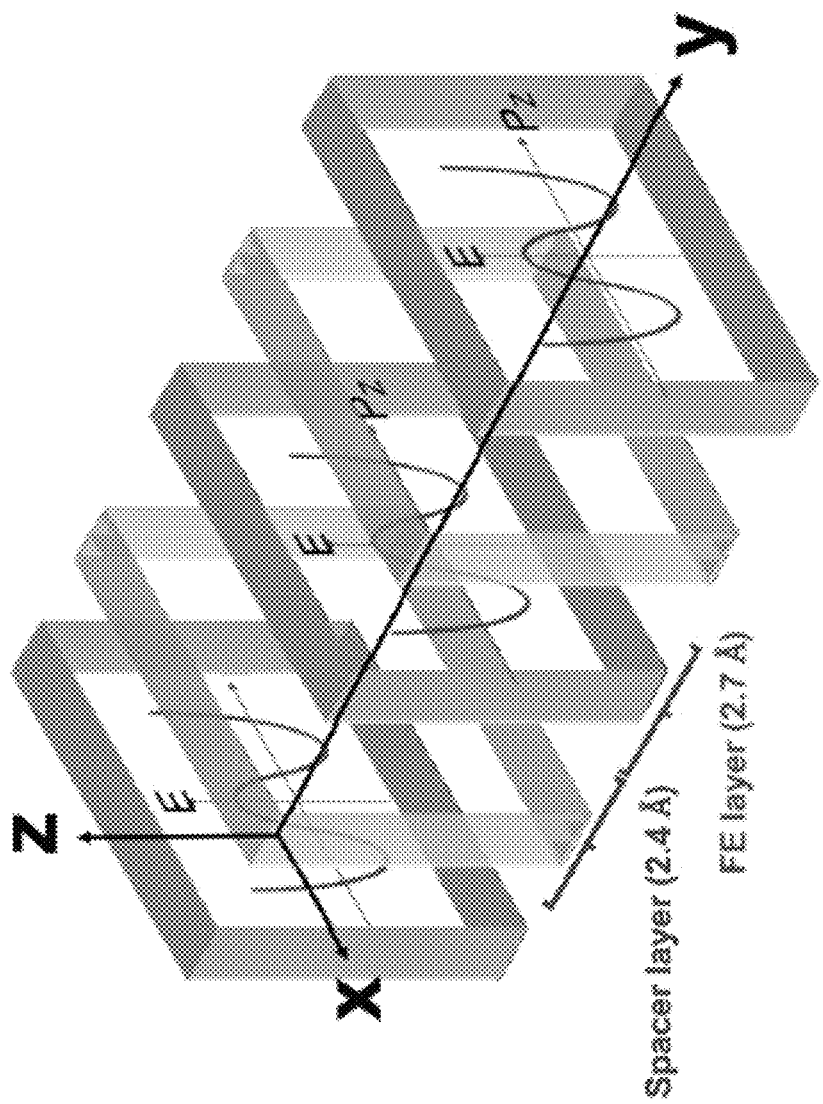
FIG. 6 is a conceptual diagram for describing independent polarization switching of a unit cell of the ferroelectric thin film according to the embodiment of the present disclosure, especially, for example, for describing the independent polarization switching within a unit cell width in which a natural patterning where a spacer having a width of 0.24 nm and a ferroelectric domain having a width of 0.27 nm exist in the Y-direction, that is, in the b-lattice direction of the ferroelectric thin film is inherently formed.

FIG. 6 is a conceptual diagram for describing independent polarization switching of a unit cell of the ferroelectric thin film according to the embodiment of the present disclosure.

Referring to FIG. 6, the spacer and the ferroelectric domain (FE layer) of the ferroelectric thin film according to the embodiment of the present disclosure have 2.4 Å and 2.7 Å, respectively, and the spacer and the ferroelectric domain may form a unit cell.

In a second axis (Y-axis) direction, the spacers and the ferroelectric domains may be alternately arranged, and due to the spacers, polarization switching of the ferroelectric domains may be individually adjusted such that each of the ferroelectric domains is not affected by other adjacent ferroelectric domains.

Accordingly, polarization characteristics of the ferroelectric domains are controlled like a single bulk film, so that the multilevel characteristics may be implemented by using the ferroelectric thin film.

Figure 7:
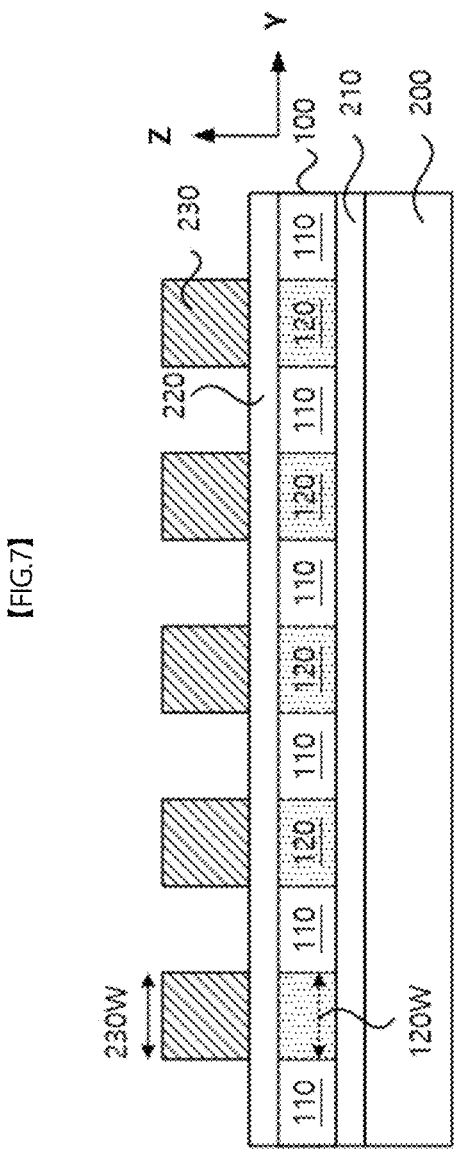
Figure 8:
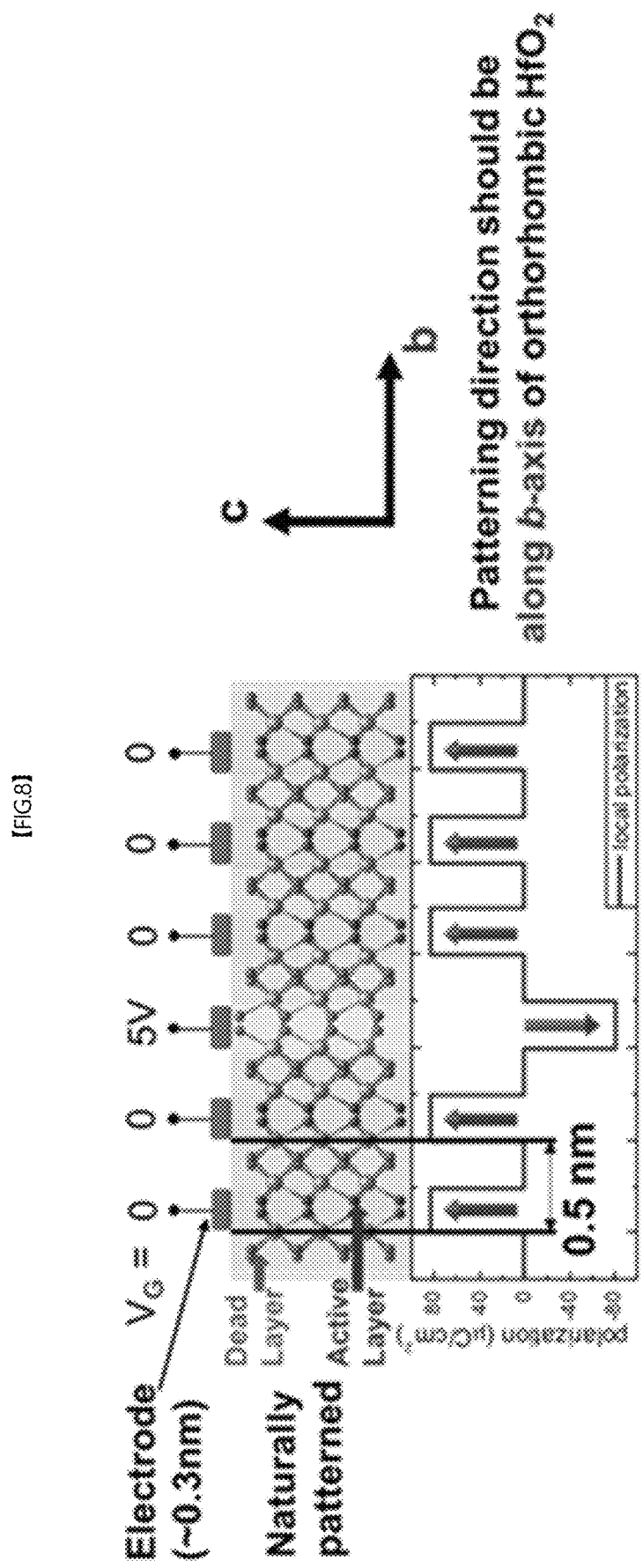

FIGS. 7 and 8 are views for describing an ultra-highly integrated memory device including a ferroelectric thin film according to a first embodiment of the present disclosure.

Referring to FIGS. 7 and 8, a memory device including a ferroelectric thin film 100 having a spacer 110 (Dead Layer of FIG. 8) and a ferroelectric domain 120 (Active Layer of FIG. 8), which is described with reference to FIGS. 1 to 6, may be provided.

The memory device may include a substrate 200, a gate insulating film 210 disposed on the substrate 200, a ferroelectric thin film 100 disposed on the gate insulating film 210, a blocking film 220 disposed on the ferroelectric thin film 100, and a gate pattern 230 disposed on the blocking film 220.

It may be apparent to those skilled in the art that the substrate 200, the gate insulating film 210, the blocking film 220, and the gate pattern 230 may be manufactured by using known materials and known manufacturing processes disclosed before the priority date of the present disclosure.

A plurality of spacers 110 and a plurality of ferroelectric domains 120 in the ferroelectric thin film 100 may be laterally, alternately, and repeatedly arranged in a direction parallel to a top surface of the substrate 200. For example, the spacers 110 and the ferroelectric domains 120 may be laterally, alternately, and repeatedly arranged in the b-lattice direction.

A width 230W of the gate pattern 230 may be greater than or equal to a width 120W of the ferroelectric domain 120, and may be narrower than a sum of the width 120W of the ferroelectric domain 120 and a width of the spacer. Accordingly, the gate pattern 230 may overlap one of the ferroelectric domains 120. In other words, one ferroelectric domain 120 and one gate pattern 230 may overlap each other so as to be included in one memory cell.

In conclusion, ultra-highly integrated memory cells corresponding to a number of unit cells existing in the ferroelectric thin film 100, that is, a number of the ferroelectric domains 120 may be defined on the substrate 200. That is, a plurality of gate patterns 230 corresponding to the unit cells of the ferroelectric thin film 100, respectively, may be formed by using the ferroelectric thin film 100 having multi-levels, so that substantially scale-free memory cells corresponding to the number of the unit cells of the ferroelectric thin film 100 may be defined on the substrate 200. In other words, as shown in FIG. 8, when the gate patterns are provided, an operating voltage (e.g., 5 V) may be selectively applied to one of the gate patterns, so that a polarization characteristic of the ferroelectric domain 120 (Active Layer) overlapping the one of the gate patterns may be individually switched so as to be reversed.

In the memory device shown in FIG. 7, the blocking film 220 may be patterned to be the same as a side wall of the gate pattern 230 so as to have a substantially common surface. It may be apparent to those skilled in the art that structures and shapes of the blocking film 220 and the gate insulating film 210 may be variously changed.

Figure 9:
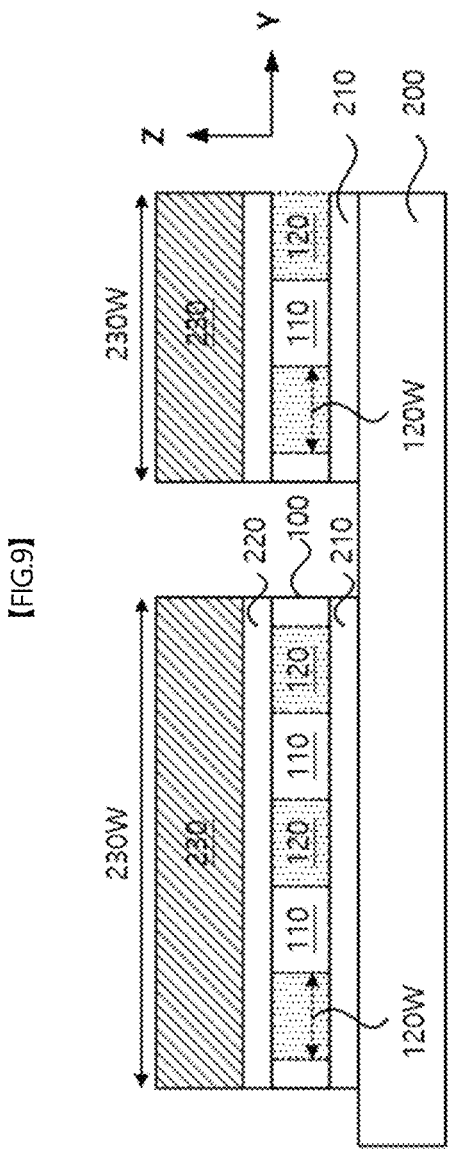
FIGS. 9 and 10 are views for describing a memory device including a ferroelectric thin film according to a second embodiment of the present disclosure, especially, for example, for describing a line-type memory device in which separation spaces are arranged in the b-lattice direction, and when a line-type electrode in which separation spaces are arranged in the b-lattice direction is used, an electrode having a width of several nanometers is possible.
Figure 10:
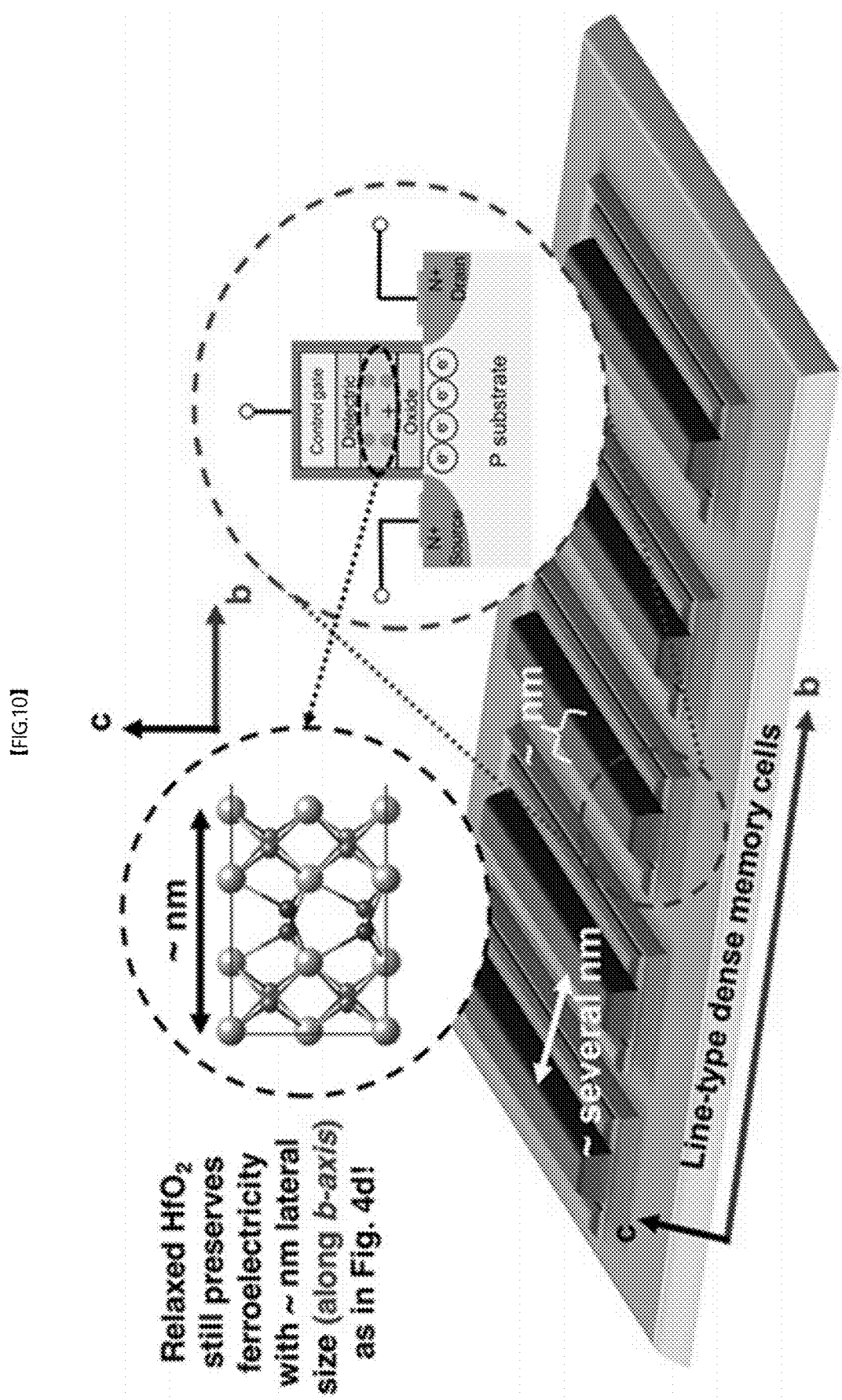

FIGS. 9 and 10 are views for describing a memory device including a ferroelectric thin film according to a second embodiment of the present disclosure.

Referring to FIGS. 9 and 10, a memory device including a ferroelectric thin film 100 having a spacer 110 and a ferroelectric domain 120, which is described with reference to FIGS. 1 to 6, may be provided.

The memory device may include a substrate 200, a gate insulating film 210 disposed on the substrate 200, a ferroelectric thin film 100 disposed on the gate insulating film 210, a blocking film 220 disposed on the ferroelectric thin film 100, and a gate pattern 230 disposed on the blocking film 220.

As described with reference to FIGS. 7 and 8, it may be apparent to those skilled in the art that the substrate 200, the gate insulating film 210, the blocking film 220, and the gate pattern 230 may be manufactured by using known materials and known manufacturing processes disclosed before the filing date of the present disclosure.

In a direction parallel to a top surface of the substrate 200 (in a b-lattice direction), a width 230W of the gate pattern 230 may be wider than a width 120W of the ferroelectric domain 120. In addition, the width 230W of the gate pattern 230 may be wider than a sum of the width 120W of the ferroelectric domain 120 and a width of the spacer 110. Accordingly, the gate pattern 230 may overlap a plurality of ferroelectric domains 120. In other words, one gate pattern 230 may overlap more than one ferroelectric domain 120. According to one embodiment, one gate pattern 230 may overlap two or more of the ferroelectric domains 120. Alternatively, according to another embodiment, one gate pattern 230 may overlap one ferroelectric domain 120, and may simultaneously overlap at least a part of another ferroelectric domain 120. In other words, more than one ferroelectric domain 120 and one gate pattern 230 may overlap each other so as to be included in one memory cell.

As shown in FIG. 10, a plurality of gate patterns may be spaced apart from each other to have a line-type configuration in a b-axis direction (a Y-axis direction of FIG. 9). In addition, a number of memory cells defined on the substrate 200 may be controlled according to a line width of the gate pattern, and a plurality of memory cells may be generated on the substrate 200. In other words, a plurality of gate patterns 230 overlapping a plurality of unit cells of the ferroelectric thin film 100, respectively, may be formed by using the ferroelectric thin film 100 having multi-levels, so that memory cells that are highly integrated in a unit of several nanometers in a lateral direction may be defined on the substrate 200.

Figure 11:
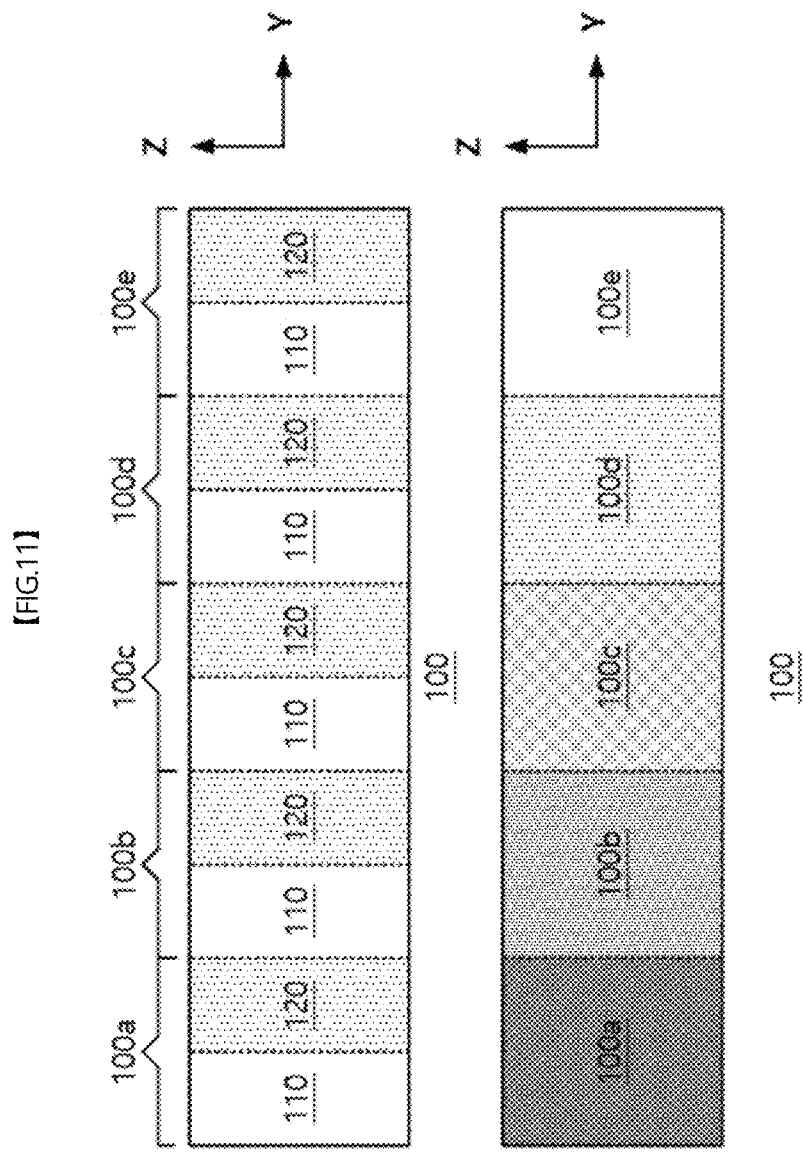
FIG. 11 is a view for describing a doped ferroelectric thin film according to a first embodiment of the present disclosure.
Figure 12:
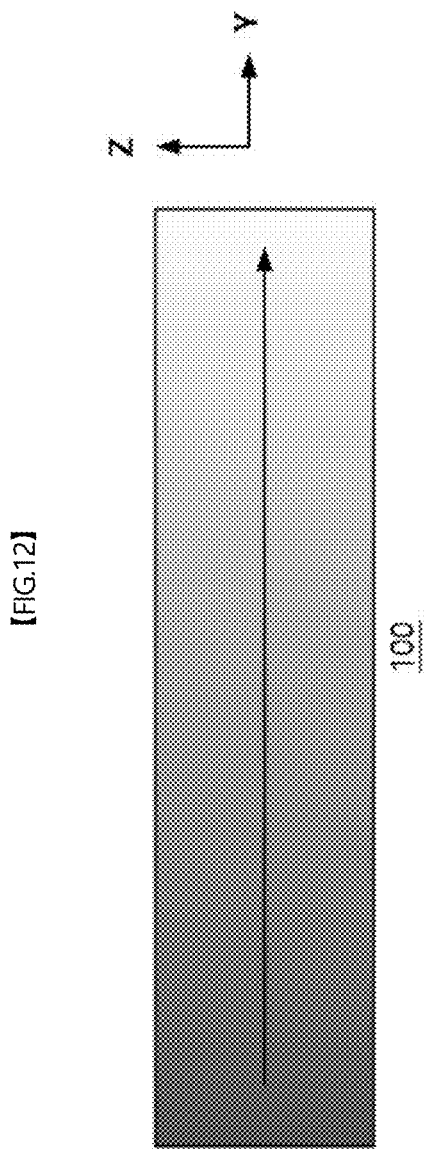
FIG. 12 is a view for describing a doped ferroelectric thin film according to a second embodiment of the present disclosure.

FIG. 11 is a view for describing a doped ferroelectric thin film according to a first embodiment of the present disclosure, and FIG. 12 is a view for describing a doped ferroelectric thin film according to a second embodiment of the present disclosure.

Referring to FIGS. 11 and 12, the ferroelectric thin film 100 having the spacer 110 (Dead Layer of FIG. 8) and the ferroelectric domain 120 (Active Layer of FIG. 8), which is described with reference to FIGS. 1 to 6, may be doped with a doping element.

The doping element may include at least one of Si, Al, Ge, La, Y, Ba, Sr, Ti, Zr, Sn, Sc, Ta, Nb, Fe, Pr, or Sb. The doping element may be doped to have a concentration gradient in a direction (the Y-axis direction) in which the spacers 110 and the ferroelectric domains 120 are alternately arranged.

According to the first embodiment, as shown in FIG. 11, first to fifth regions 100a to 100e may be provided in the ferroelectric thin film 100 according to a doping concentration of the doping element, and the first to fifth regions 100a to 100e may have doping concentrations that are sequentially lowered.

When the ferroelectric thin film 100 is doped with the doping element, an operating voltage value at which a polarization of the ferroelectric domain 120 in the ferroelectric thin film 100 is switched may be controlled according to the concentration of the doping element. In detail, as the concentration of the doping element increases, the operating voltage value may be decreased. For example, the operating voltage value may become lower in order of the ferroelectric domains 120 in the fifth region 110e, the ferroelectric domain 120 in the fourth region 110d, the ferroelectric domain 120 in the third region 110c, the ferroelectric domain 120 in the second region 110b, and the ferroelectric domain 120 in the first region 110a.

Accordingly, the ferroelectric domains 120 may have mutually different operating voltage values, and even when one gate pattern overlaps a plurality of ferroelectric domains 120, the multilevel characteristics of the memory cells may be implemented.

According to the second embodiment, unlike the configuration described with reference to FIG. 11, the doping element may have a concentration gradient in the ferroelectric thin film 100 such that the doping concentration is gradually decreased, that is, continuously decreased. Accordingly, according to the doping concentration, the first to fifth regions 100a to 100e may not be clearly distinguished from each other as shown in FIG. 11. Even in this case, an operating voltage value of the ferroelectric domain 120 may be controlled according to the doping concentration of the doping element, so that multilevel memory cells may be implemented with only a single gate pattern. Meanwhile, depending on a manufacturing process, the doping concentration may be discontinuously and discretely reduced. In this case, operating voltages in levels in the multilevel device may be more clearly distinguished from each other.

Figure 13:
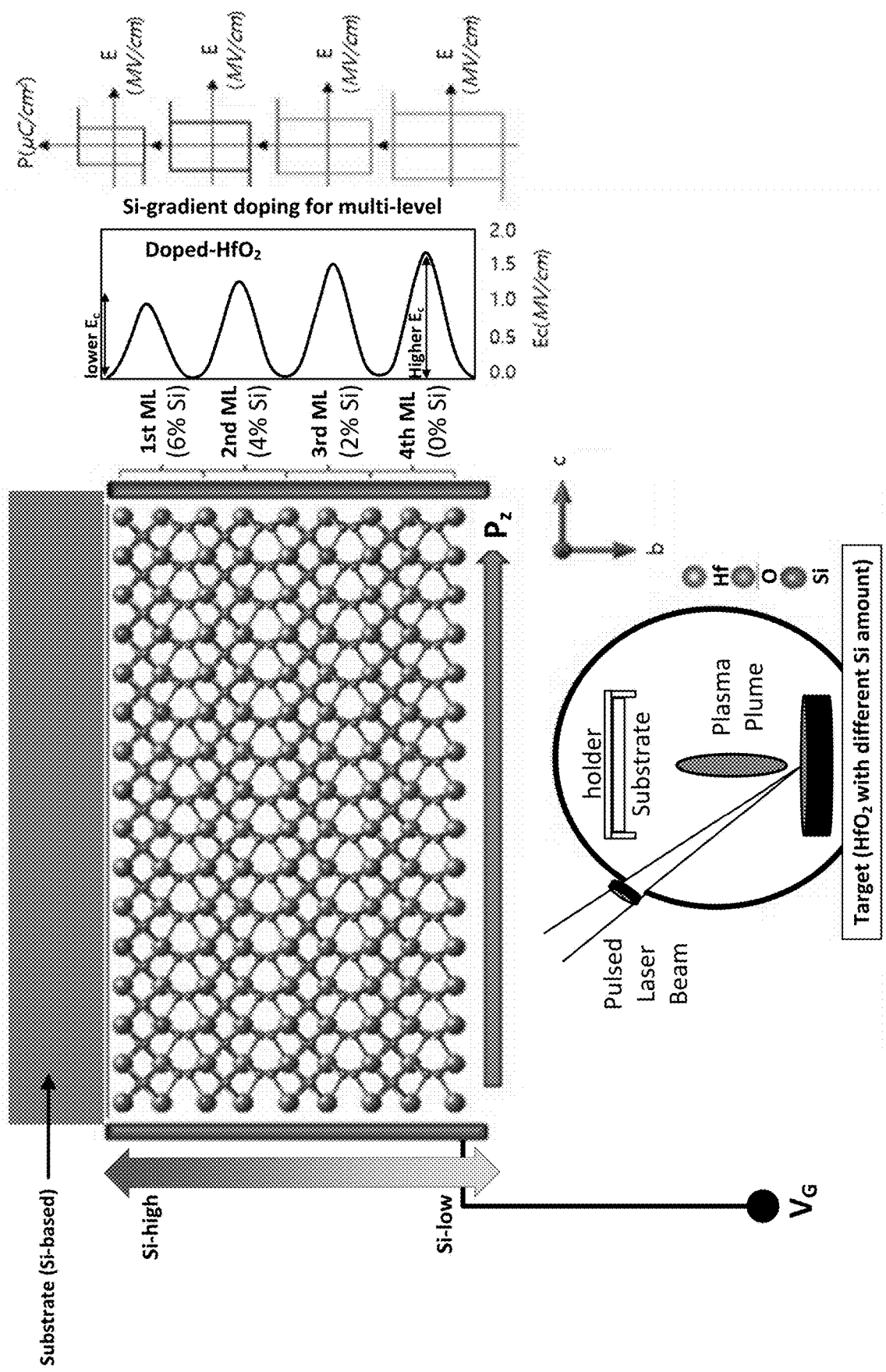
FIG. 13 is a view for describing a method of manufacturing a multilevel ferroelectric thin film having a lateral doping concentration gradient in a b-lattice direction according to a first embodiment of the present disclosure.

FIG. 13 is a view for describing a method of manufacturing a ferroelectric thin film having a doping concentration gradient according to a first embodiment of the present disclosure, and FIG. 14 is a view for describing a method of manufacturing a ferroelectric thin film having a doping concentration gradient according to a second embodiment of the present disclosure.

Referring to FIG. 13, according to the first embodiment, the ferroelectric thin film according to the embodiment of the present disclosure may be deposited by the pulsed laser deposition. In a process of depositing the ferroelectric thin film by the pulsed laser deposition, the ferroelectric thin film may be deposited in a unit of a mono-layer, and a target to which a laser is irradiated during the deposition process may include doping elements having mutually different concentrations, so that as shown in FIG. 13, for example, the ferroelectric thin film having a first mono-layer doped with 6% of silicon, a second mono-layer doped with 4% of silicon, a third mono-layer doped with 2% of silicon, a fourth mono-layer that is not doped with silicon may be formed. Thus, the ferroelectric thin film is deposited in the c-lattice direction of $HfO_2$ parallel to the substrate, with digitalized Si doping ratios, as illustrated in FIG. 13. This provides for pulsed laser deposition with digitalized doping-ratio control along the b-lattice direction of $HfO_2$.

The ferroelectric thin film may have a concentration gradient of the doping element (silicon) in the b-axis direction of FIG. 13 (the Y-axis direction of FIG. 1), so that an operating voltage value may be controlled. In detail, as the doping concentration becomes higher, the operating voltage value may be lowered. This process may discontinuously and discretely adjust the doping concentration. In this case, operating voltages in levels in the multilevel device may be more clearly distinguished from each other.

Alternatively, otherwise, referring to FIG. 14, according to the second embodiment, the ferroelectric thin film may be deposited, and silicon may be deposited onto the ferroelectric thin film through chemical vapor deposition (CVD) or sputtering by using a moving mask. In FIG. 14, one region of the ferroelectric thin film on a left side may be exposed for a longest time so that the ferroelectric thin film may be doped with the doping element (silicon) having a highest concentration, and one region of the ferroelectric thin film on a right side may be exposed for a shortest time so that the ferroelectric thin film may be doped with the doping element having a lowest concentration, or may not be doped with the doping element. This process may also discontinuously and discretely adjust the doping concentration when an exposure time is appropriately adjusted. In this case, operating voltages in levels in the multilevel device may be more clearly distinguished from each other.

It may be apparent that the ferroelectric thin film may be doped with the doping element with a concentration gradient in various ways in addition to the above-described processes with reference to FIGS. 13 and 14.

FIG. 15 is a view for describing a multilevel characteristic of a semiconductor device including a ferroelectric thin film according to the embodiment of the present disclosure.

Referring to FIG. 15, according to the embodiment of the present disclosure, nine states were implemented by using the ferroelectric thin film including the ferroelectric domain and the spacer. As shown in FIG. 15, State 1 in which all ferroelectric polarizations are saturated downward was implemented by applying a voltage of −2 MV/cm or more, States 2 to 8 were implemented by independently switching polarization directions in a unit of a unit cell in the b-lattice direction, that is, by independently switching polarization directions of the ferroelectric domains as the activation field applied to the semiconductor device gradually increases (0 to 2 MV/cm), and finally, State 9 was implemented in an activation field condition of 2 MV/cm or more. Additional multi-levels may be implemented as the number of unit cells in the b-lattice direction increases.

In conclusion, it may be found that the polarization directions of the ferroelectric domains may be independently switched so as to implement the multi-levels.

Although the exemplary embodiments of the present disclosure have been described in detail, the scope of the present disclosure is not limited to a specific embodiment, and should be interpreted by the appended claims. In addition, it should be understood by those of ordinary skill in the art that various changes and modifications can be made without departing from the scope of the present disclosure.

INDUSTRIAL APPLICABILITY

The technical idea according to an embodiment of the present disclosure may be utilized in various industrial fields such as fields of ultra-high density memories, multilevel memories, transistors, displays, system semiconductors, and image sensors.

The invention claimed is:

1. A memory device comprising:
a substrate;
a gate insulating film disposed on the substrate;
a ferroelectric thin film disposed on the gate insulating film;
a blocking film disposed on the ferroelectric thin film; and
a gate pattern disposed on the blocking film,
wherein the ferroelectric thin film includes a unit cell comprising (a) a first ferroelectric domain having a polarization controlled by an externally applied electric field and including phonons capable of displacement in a first axial direction, and (b) a first spacer having a fixed polarization regardless of the externally applied electric field, and blocking elastic interactions between the phonons of the first ferroelectric domain and phonons in a second ferroelectric domain;
wherein a plurality of spacers and a plurality of ferroelectric domains are alternately and repeatedly provided in a direction parallel to a top surface of the substrate, the plurality of spacers including the first spacer and the plurality of ferroelectric domains including the first and second ferroelectric domains; and wherein each of the plurality of ferroelectric domains and each of the plurality of spacers have a width corresponding to half of a width of the unit cell.

2. The memory device of claim 1, wherein, in the direction parallel to the top surface of the substrate, a width of the gate pattern is greater than or equal to the width corresponding to half of the width of the unit cell.

3. The memory device of claim 1, wherein
a plurality of gate patterns are provided over the substrate, and
each of the gate patterns overlaps one of the plurality of ferroelectric domains.

4. The memory device of claim 1, wherein, in the direction parallel to the top surface of the substrate, a width of the gate pattern is wider than the width of the unit cell.

5. The memory device of claim 1, wherein the gate pattern overlaps the plurality of ferroelectric domains.

6. The memory device of claim 1, wherein each of the spacers is provided between two of the plurality of ferroelectric domains, so that polarizations of the two ferroelectric domains are controlled independently from each other.

7. The memory device of claim 1, wherein the first ferroelectric domain contacts two spacers of the plurality of spacers.

8. A semiconductor device comprising:
a substrate;
a ferroelectric thin film disposed on the substrate, and including (a) a plurality of ferroelectric domains spaced apart from each other and having polarizations controlled independently from each other in a b-lattice direction, and (b) a spacer positioned between two of the ferroelectric domains, wherein the spacer has a fixed polarization regardless of an externally applied electric field, and wherein the spacer blocks interactions between phonons of the two ferroelectric domains; and
a gate pattern disposed on the ferroelectric thin film.

9. The semiconductor device of claim 8, wherein the ferroelectric domains are laterally spaced apart from each other in the b-lattice direction.

10. The semiconductor device of claim 8, wherein the gate pattern overlaps at least one of the ferroelectric domains.

11. The semiconductor device of claim 8, wherein
the ferroelectric thin film includes a metal oxide doped with a doping element, and
the doping element has a concentration gradient within the ferroelectric thin film in a direction parallel to a top surface of the substrate.

12. The semiconductor device of claim 11, wherein the doping element includes at least one of Si, Al, Ge, La, Y, Ba, Sr, Ti, Zr, Sn, Sc, Ta, Nb, Fe, Pr, or Sb.

13. The semiconductor device of claim 8, wherein the spacer and one of the two ferroelectric domains form a unit cell, the spacer and the one of the two ferroelectric domains having equal widths.

* * * * *